United States Patent
Brown et al.

[11] Patent Number: 6,128,201
[45] Date of Patent: Oct. 3, 2000

[54] THREE DIMENSIONAL MOUNTING ASSEMBLY FOR INTEGRATED CIRCUITS

[75] Inventors: Sammy K. Brown, Los Gatos; George E. Avery, Saratoga; Andrew K. Wiggin, San Carlos; Tom L. Todd, San Jose; Sam Beal, Mountain View, all of Calif.

[73] Assignee: Alpine Microsystems, Inc., Campbell, Calif.

[21] Appl. No.: 09/083,626

[22] Filed: May 22, 1998

Related U.S. Application Data

[60] Provisional application No. 60/047,531, May 23, 1997.

[51] Int. Cl.$^7$ .................................................. H05K 1/14
[52] U.S. Cl. ...................... 361/784; 361/736; 361/788; 361/790; 361/803; 361/809; 439/61
[58] Field of Search ............................ 257/723, 724, 257/678, 700; 361/784, 758, 728, 729, 730, 733, 735, 736, 788, 790, 803, 807, 809; 365/51, 52, 63; 439/59, 61, 65, 82, 83

[56] References Cited

U.S. PATENT DOCUMENTS

| | | | |
|---|---|---|---|
| 4,109,298 | 8/1978 | Hanni et al. | 361/803 |
| 5,334,857 | 8/1994 | Mennitt et al. | 257/48 |
| 5,349,235 | 9/1994 | Lee et al. | 257/693 |
| 5,397,997 | 3/1995 | Tuckerman et al. | 324/754 |
| 5,426,563 | 6/1995 | Moresco et al. | 361/689 |
| 5,532,612 | 7/1996 | Liang | 324/760 |
| 5,532,614 | 7/1996 | Chiu | 324/763 |
| 5,539,325 | 7/1996 | Rostoker et al. | 324/763 |
| 5,541,450 | 7/1996 | Jones et al. | 257/697 |
| 5,544,017 | 8/1996 | Beilin et al. | 361/790 |
| 5,579,987 | 12/1996 | Lee et al. | 228/180.21 |
| 5,592,019 | 1/1997 | Ueda et al. | 257/666 |
| 5,629,839 | 5/1997 | Woychik | 361/803 |
| 5,635,760 | 6/1997 | Ishikawa | 257/692 |
| 5,661,901 | 9/1997 | King | 29/830 |
| 5,674,785 | 10/1997 | Akram et al. | 438/15 |
| 5,729,894 | 3/1998 | Rostoker et al. | 29/832 |
| 5,731,227 | 3/1998 | Thomas | 438/125 |

FOREIGN PATENT DOCUMENTS

| | | | |
|---|---|---|---|
| 2591054 | 6/1987 | France | 439/65 |
| 1-289191 | 11/1989 | Japan | 439/65 |
| 3-55896 | 3/1991 | Japan | 439/83 |

*Primary Examiner*—Leo P. Picard
*Assistant Examiner*—John B. Vigushin
*Attorney, Agent, or Firm*—Global Patent Industries; Kenneth C. Brooks

[57] ABSTRACT

A system and method for efficiently interconnecting a plurality of ICs, thereby improving the electrical performance of the overall system. In one embodiment of the system of the present invention, a plurality of carriers corresponds to a plurality of ICs, and a board has a plurality of board regions for receiving the plurality of ICs and are arranged so as to be attached to a backplane forming a vertical stack of boards.

19 Claims, 11 Drawing Sheets

THREE DIMENSIONAL MOUNTING ASSEMBLY FOR INTEGRATED CIRCUITS

CROSS REFERENCE TO RELATED APPLICATIONS

This application is a nonprovisional application of U.S. provisional patent application "A SYSTEM AND METHOD FOR PACKAGING INTEGRATED CIRCUITS," U.S. Serial No. 60/047,531, filed May 23, 1997, having Sammy K. Brown, George E. Avery, and Andrew K. Wiggin, Tom L. Todd and Sam Beal listed as co-inventors and assigned to Alpine Microsystems. The 60/047,531 application is hereby incorporated by reference in its entirety.

BACKGROUND OF THE INVENTION

The present invention relates to the packaging of semiconductor devices, and more particularly to a system and method for interconnecting integrated circuits (ICs) on a semiconductor substrate.

Electronic systems typically are manufactured from two or more ICs to provide complete system function. Until recently the limitations on performance and number of I/O pins were not significant for the vast majority of applications. However, as more devices are integrated in a single IC and as clock speeds increase, limitations on performance and number of I/O pins would be of paramount concern to semiconductor manufacturers. This is because the overall performance of the system is based on multiple ICs is a function of the performance of the individual ICs and of the performance of the signals between the ICs. The performance of the signals between the ICs is in turn a function of the number of signals and the electrical characteristics of the means used to connect the I/O pins of the ICs. A more efficient means for interconnecting ICs is therefore becoming an important influence on the cost, size, performance, weight, and efficiency of electronic systems.

Currently, the most common method used for interconnecting ICs is to first package the individual ICs, and then mount the packaged ICs on a substrate such as a printed circuit board. The size of the package is typically several times larger than the IC and is often manufactured from a metal lead frame and protected within a plastic molded case. The packaged ICs are then placed and soldered to a printed circuit board to create a complete electronic system. The advantages of the current method include low cost and protection of the IC during subsequent handling. In addition, the package acts as a standardized carrier for testing of the IC, such that design changes to the printed circuit board may be made cheaply and quickly. Assembly of the IC to the printed circuit board may further be automated. Finally, the current system allows rework of the printed circuit.

A more efficient method is necessary, however, as advanced ICs require higher performance and larger number of I/O pins than is possible with conventional interconnect technology. The conventional method has limited electrical performance and limited ability to remove heat. The electrical parasitic characteristics of the package, the length of conductors, the electrical parasitic introduced by the structures of the printed circuit board, and the dielectric material used in the printed circuit board all limit the electrical performance of the method. These limitations in turn limit the number of signals on the system to at most a few hundred regardless of the complexity of the IC or the system. Since the current IC interconnection has lower performance than the ICs, it limits the overall system performance.

Integrated circuits are performing at above 100 MHz. The current method of interconnecting ICs is, however, limited to systems operating below 100 MHz. An efficient means of interconnecting integrated circuits is therefore necessary to keep pace with corresponding advances in integrated circuit performance.

SUMMARY OF THE INVENTION

The present invention provides a system and method for efficiently interconnecting a plurality of ICs, thereby improving the electrical performance of the overall system.

In one embodiment of the system of the present invention, a plurality of carriers corresponds to a plurality of ICs, and a board has a plurality of board regions for receiving the plurality of ICs. Each carrier has first and second sets of contacts, and a set of interconnects therebetween. The first set of contacts connects to contacts on the corresponding IC when the corresponding IC is mounted to the carrier's surface. Each board region has a set of board contacts connecting to the respective carrier's second set of contacts, and the board has a set of board interconnects connecting selected contacts of the set of board contacts. The plurality of board regions are further formed with an opening sized to clear the respective carrier's IC when the respective carrier is mounted to the board.

In one embodiment of the method of the present invention, a plurality of ICs is mounted to corresponding carriers. Each corresponding carrier has a surface with sufficient contacts, and a set of contacts on the carrier is routed to a set of contacts on the IC using embedded interconnects. A board having openings is provided, and the ICs are fitted into openings in the board with the carriers engaging the board.

These and other embodiments of the present invention, along with many of its advantages and features, are described in more detail in the text below and the attached figures. In the figures, like reference numerals indicate identical or functionally similar elements.

DESCRIPTION OF THE PREFERRED EMBODIMENT

The present invention provides a system and a method for efficient interconnection of ICs to form a complex electronic component with improved overall system performance.

Figure 1:
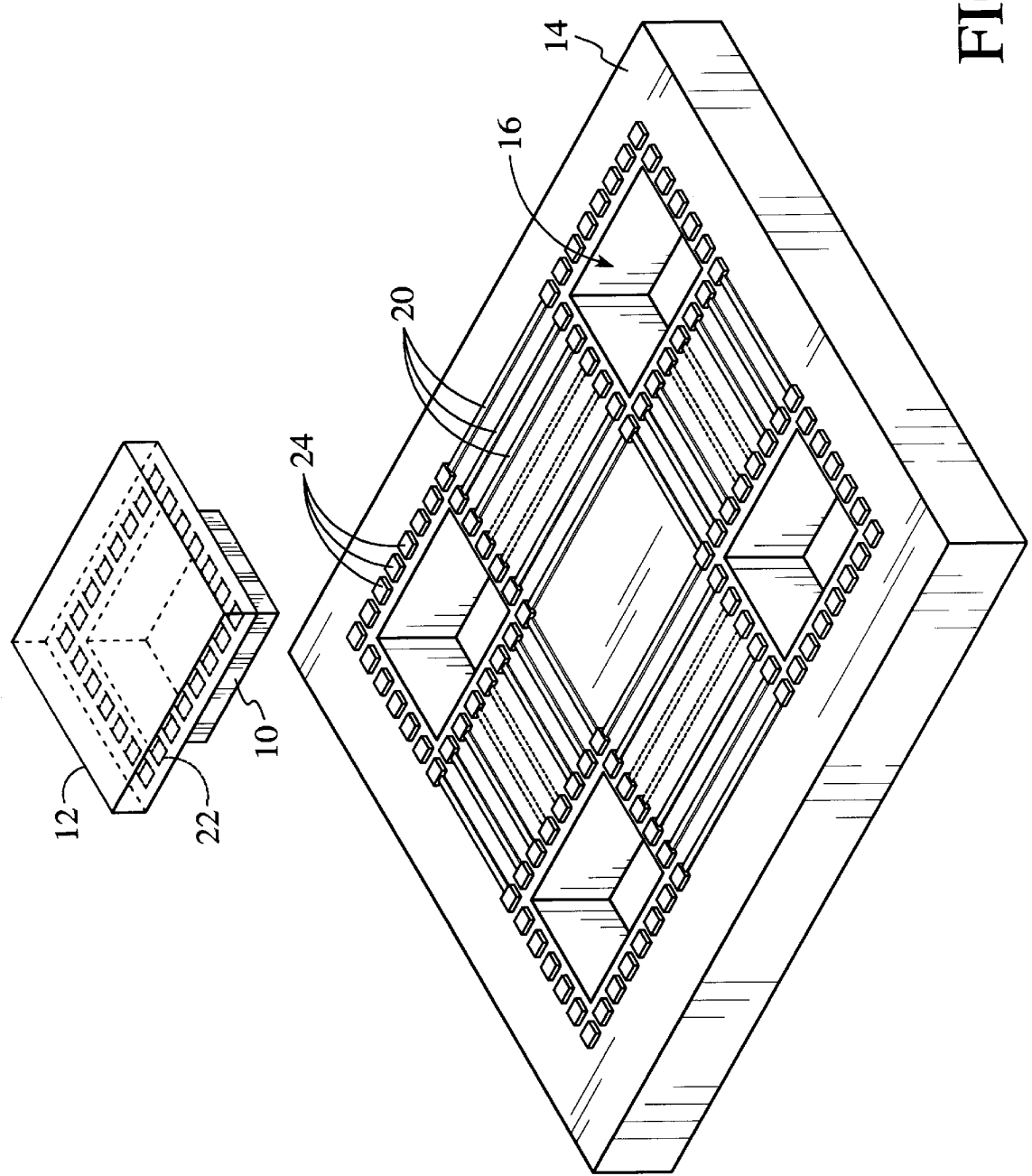
FIG. 1 shows an exploded view of the different components for efficient interconnection of ICs according to the system of the present invention.

FIG. 1 shows an exploded view of an integrated circuit (IC) 10 mounted to a carrier 12, and a board 14 with a plurality of openings 16. As shown, board 14 has four openings 16, however, the number of openings 16 changes according to the number of carriers to be connected to board 14. Similarly, though openings 16 are shown to be of equal sizes, they may differ in size in another example as the sizes of the openings are determined by the sizes of the ICs to be electrically connected to board 14. In the example as shown in FIG. 1, carrier 12 is connected to IC 10 only. However, as later discussed, carrier 12 may be connected to more than one IC or to other electronic components. If carrier 12 is connected to only one IC, the number of carriers for the system will depend on the number of ICs in the complex IC. In a preferred embodiment, the sizes of the carriers correspond to the sizes of the ICs in the complex IC, and the size of the board corresponds to the size of the complex IC.

Carrier 12 is preferably thermally compatible with board 14 and IC 10, since carrier 12 connects IC 10 and board 14. Thermal expansion compensation between IC 10, carrier 12, and board 14 may be accomplished by the use of compliant materials such as wires to make connections between the IC and the package. Alternatively, bonding materials may be used to limit the stresses. The preferred method, however, is to have carrier 12 and board 14 be made of materials with similar Coefficient of Thermal Expansion (CTE) as IC 10. In a preferred embodiment, carrier 12 and board 14 are made of the same material as IC 10. Since ICs are typically manufactured from single crystal silicon, which has a relatively low CTE, silicon is the preferred carrier and board material. However, gallium arsenide or other materials with comparable CTE may also be utilized.

FIG. 1 also shows the interconnections on board 14. Board 14 is manufactured employing semiconductor photo lithographic processes; hence, the routing density of board interconnections 20 on board 14 is higher than that for conventional board level interconnect. Connections 22 on carrier 12 are pre-manufactured to fit the bond pad pattern of connections 24 on board 14. Board 14, therefore, serves both as a mechanical base and implements at least a single layer of routing through interconnections 20 between neighboring carriers and ICs. There are preferably no vias in board 14 as the IC interconnections are preferably distributed among the carriers by allowing signals between the ICs to be passed through neighboring chips. Since all subsystem routing is preferably distributed across the individual carriers, the complexity of the board routing is reduced to single node sets. Compared to a single interconnection board, interconnection distributions among the carriers greatly simplify the interconnection task, and significantly improve the overall system performance. Although board 14 preferably has only one level of interconnect, in applications where yield is not critical, board 14 could have multiple levels of interconnect. In such applications, there would be vias in board 14 as the interconnections would include pass-throughs as well as crossovers.

Figure 2A:
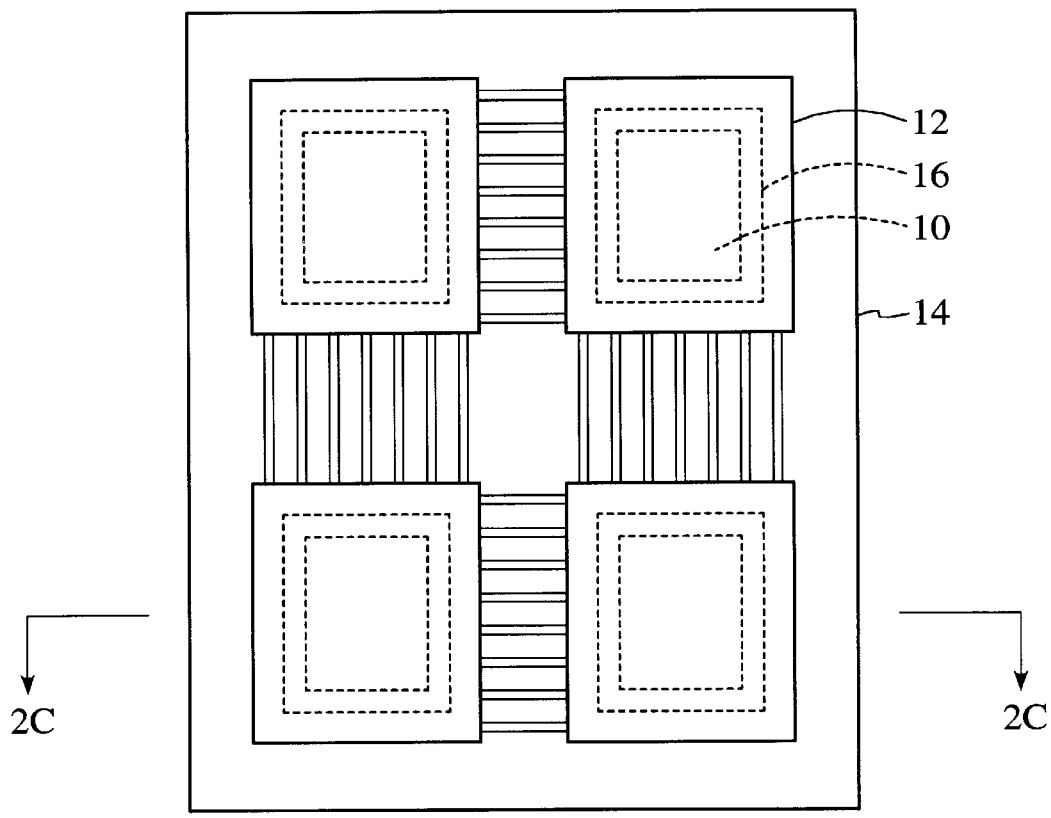
FIGS. 2A–2C show a top view of the IC/carrier subassembly on the board, a side view of the IC/carrier subassembly, and a side view of the IC/carrier subassembly on the board, respectively.
Figure 2B:
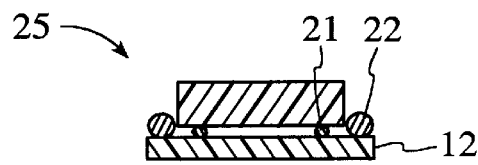
Figure 2C:
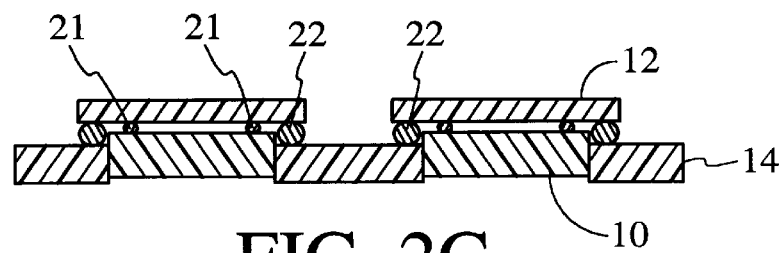

FIGS. 2A–2C show a top view of an IC/carrier subassembly 25 on board 14, a side view of IC/carrier subassembly 25, and a side view of IC/carrier subassembly 25 on board 14, respectively. As shown in FIG. 2B, subassembly 25 consists of IC 10 mounted to carrier 12. Carrier 12 is pre-manufactured with solder bumps (shown as connections 21 and 22) which are placed in arrays aligned to mirror the bond pad patterns of IC 10 and board 14, respectively. IC 10 is flip chip bonded to carrier 12 through connections 21. As shown in FIG. 2C, each subassembly 25 is mounted to board 14 so that IC 10 will fit within opening 16. As can be seen, carrier 12 extends around opening 16 and connects to board 14 through connections 22. Typically, the number of connections 21 between IC 10 and carrier 12 will not be equal to the number of connections 22 between carrier 12 and board 14.

The use of opening 16 enables all of the signal connections to lie in a plane formed by the top side of IC 10, the top side of carrier 12, and the top side of board 14. This configuration is very advantageous, as the chemical properties of silicon are such that it is impractical to form plated vias through silicon materials thicker than a few tenth of a micron. By using the same materials for carrier 12 and board 14, direct solder connections may be made between carrier 12 and board 14. Since IC 10 and carrier 12 are preferably made of the same materials, signal connections may also be directly soldered on the carrier and connected to the IC. As previously discussed, the solder bumps on carrier 12 are aligned to mirror IC 10's bond pad pattern. Hence, IC 10 need not be solder bumped.

The advantage of using solder bumps to connect the IC to the carrier, and the carrier to the board is that an area array may be used to maximize the number of external signal connections available. In addition, parasitics associated with wire bonding may be eliminated. Solder bump flip chip bonding is an automated process, and bumping cost does not increase with pin count. Hence, the use of solder bumps also enables integration of higher I/O pin counts while keeping cost low.

Figure 3:
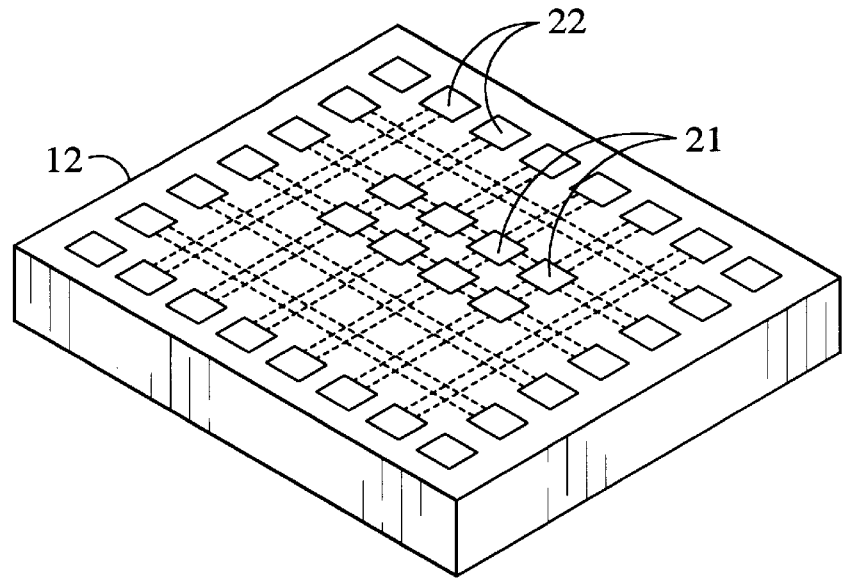
FIG. 3 shows an example set of electrical interconnections on a carrier.

FIG. 3 shows an exemplary electrical interconnection configuration on carrier 12. For simplicity, a relatively small number of connections are shown. As can be seen, carrier 12 has connections 22 along its peripherals and connections 21 around its central portion. Connections 21 and 22 connect IC 10 to carrier 12, and carrier 12 to board 14, respectively. Connections 21 may be routed to connections 22 using embedded interconnects, and such routing may have at least one crossover. These crossovers allow signals to be passed to and from the IC on carrier 12. In addition, the signal paths on carrier 12 may be independent of the IC routing. These independent signal paths serve as pass throughs for signals from a neighbor IC to other neighboring ICs. In this manner, interconnection of the ICs are distributed across the individual carriers.

Connections 21 and 22 are predetermined according to the application of the particular complex ICs. Since connections 21 and 22 are manufactured using semiconductor photolithography techniques, the resulting routing density is very similar to the density of on-chip interconnect. Specifically, connections 21 and 22 are made through inner and outer rows of solder bumps, deposited in patterns to match the bond pads of the IC 10 and the board 14. This eliminates the need to place solder bumps on individual ICs. The number of connections between ICs, known as external interconnect, generally requires significantly less interconnect density than the interconnect density used to connect transistors on the IC. Hence, the external interconnection density can always be made high enough by using the same or less advanced semiconductor process that is used to fabricate the IC itself. Using this same technique, the external interconnections may also be made to fit into an area that is the same or less than the area of the IC itself. This provides a significant yield advantage over the current method as the size and area of printed circuit boards are generally many times larger than the ICs themselves.

Figure 4:
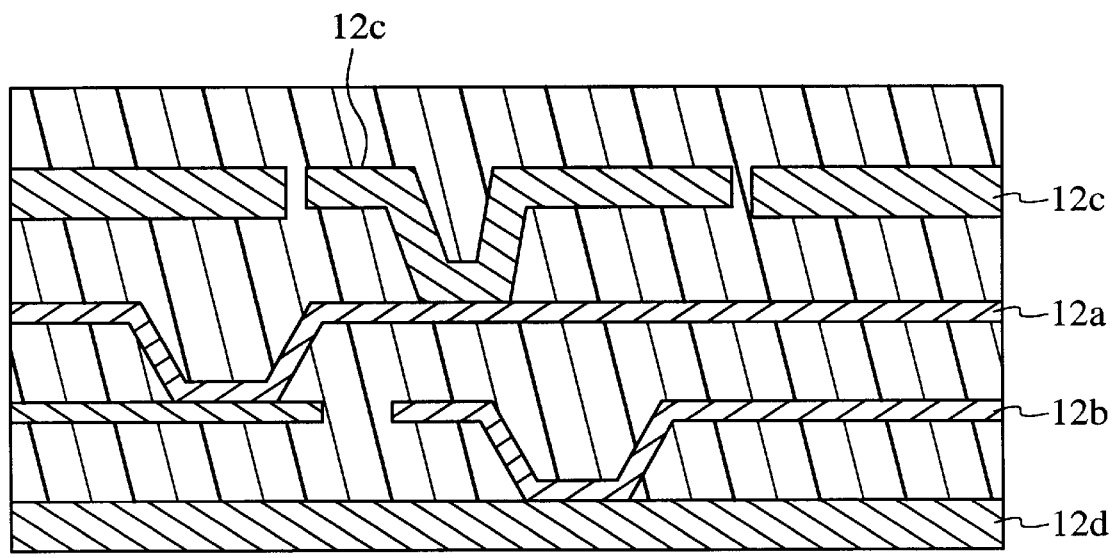
FIG. 4 is cross sectional view of the carrier shown above in FIG. 3.

Referring to both FIGS. 3 and 4, Carrier 12 is manufactured from a multi-level semiconductor metallization process. Crossovers between the signal paths are achieved through the use of vias, which are located within the same layer. Since all the vias are in the same layer, custom changes to connections 21 and 22 may be made easily at the manufacturing level by single-mask programming. For each new application, the location of the vias may be determined according to the particular IC interconnections desired. Once the locations of the vias have been determined, only the via-containing layer needs to be changed.

The carrier 12 contains a multiple level interconnection matrix with at least 800 signal paths /cm$^2$. The configuration of the interconnection matrix is mask programmable and facilitates high-speed data signal propagation in excess of 20 GHz. The input and output (I/O) signals of the IC 10 can be routed to multiple sides thereof the die, effectively tripling the I/O density of the IC 10. The carrier 12 interconnection matrix is composed of two signal layer 12a and 12b sandwiched between reference planes for power 12c and ground 12d. Each layer is 5 micrometers of electroplated copper. The power layer 12c provides a reference plane for $V_{dd}$ and includes a hiatus in which a bond pad connection 12e is disposed. By surrounding the two spaced-apart signal paths 12a and 12b between two power planes 12c and 12d, the noise, such as crosstalk and simultaneous switching noise (SSN), in the signal paths 12a and 12b is reduced.

Crosstalk results from mutual capacitance between two adjacent signal lines. For the carrier 12, the resulting crosstalk noise can be estimated as follows:

$$V_{cn} = 0.176 \times 10^{-9} (V_{in}/t_{rise})$$

where $V_{in}$=input voltage. Far end crosstalk tends to cancel and can be neglected. SSN created in the $V_{DD}/V_{SS}$ loops formed by the output buffer's discharge path is frequently called ground bounce since it is superimposed on the local ground plane 12d (applies to the power plane 12c, as well). The magnitude of the noise voltage can be approximated as follows:

$$V_{ssn} = L_{eff} dI/dt$$

where $L_{eff}$ is the effective self inductance of the die to package to ground connections. The equation tends to overestimate $V_{ssn}$ by neglecting negative feedback effects dI/dT. The circuit noise margins must be sufficient to guarantee proper operation in the presence of SSN. The flip-chip attachment process used for the carrier 12 and the board 14 assembly offers extremely low (<0.1 nH) parasitic inductance, and the carrier 12 contains non-perforated reference planes.

By surrounding the two spaced-apart signal paths 12a and 12b between two power planes 12c and 12d, the distance between each of the power planes 12c and 12d and the signal paths 12a 12b may be easily controlled so as to be constant over the volume of the carrier. This facilitates formation of a constant impedance between power plane 12c and signal path 12a, as well as power plane 12d and signal path 12b. In addition, the crosstalk is avoided by placing signal path 12a proximate to power plane 12c and signal path 12b proximate to power plane 12d. In this fashion, the return path for the current in the signal propagating along one of the paths 12a or 12b is not the signal path adjacent thereto, but rather the power plane 12c or 12d.

Noise may be further reduced by abrogating reflection noise, which is caused by an impedance mismatch between a driver and receiver. Reflection noise becomes problematic when the time of flight of a signal is comparable with the signal's rise time. Consequently, very short connections that satisfy the following constraint will minimize reflection noise problems.

$$t_{flight} < t_{rise}/4$$

For a typical carrier 12 signal interconnect, the time of flight is:

$$t_{flight} \sim 50 \text{ pS}.$$

Hence, by keeping rise and fall times >200ps, reflection noise and the resulting impact on settling time can be avoided. For 3.3V transitions, this translates into an interconnect load capacitance of <66pF per interconnect. In this fashion, the carrier 12 provides a high-density routing structure with low noise by which to interconnect various pads of a single IC 10, or multiple ICs 10.

The board 14, on the other hand, serves as a mechanical base for the carrier 12 while providing single-layer routing between adjacent carriers 12. The combination of multi-layer carrier 12 interconnection matrix and the single-layer signal path of the board 14 interconnect effectively produces a continuous connect X Y interconnect plane over the multi-chip subsystem. Carriers 12 that do not have direct connections to a board 14 adjacent thereto shares a power plane 12c or 12d with another carrier 12. Although it is not necessary, it is preferred that carriers and/or ICs 10 that are to be in data communication, i.e., electrically coupled, should be positioned proximate to each other.

In addition to providing adequate current-carrying paths for the total peak requirements of the individual IC 10, the carrier 12 and board 14 combination must provide sufficient power dissipation to satisfy the estimated power consumption of the device. In an effort to improve the power characteristics of the carrier 12 board 14 combination, it is preferred that the IC 10 employ low-swing signal techniques.

Figure 5A:
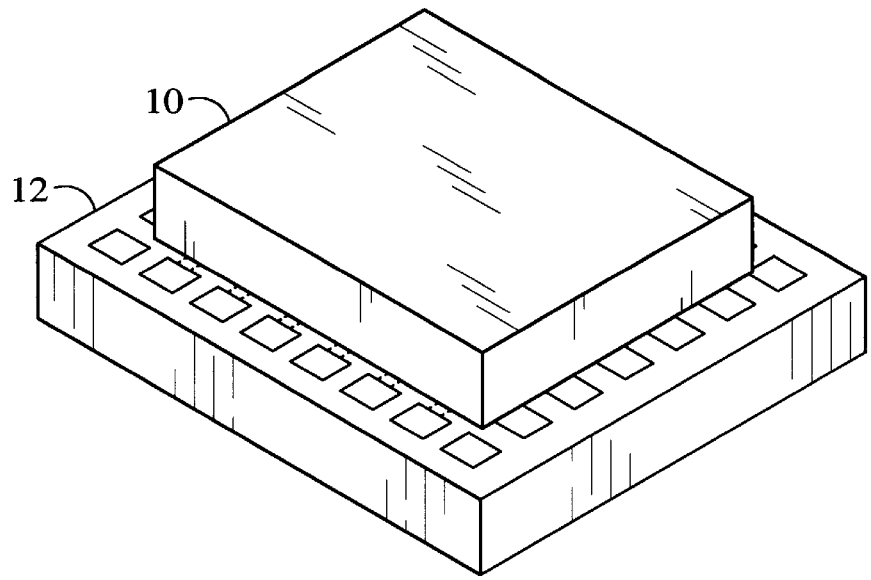
FIGS. 5A–5B show a single IC mounted on a carrier, and multiple ICs mounted on a carrier, respectively.
Figure 5B:
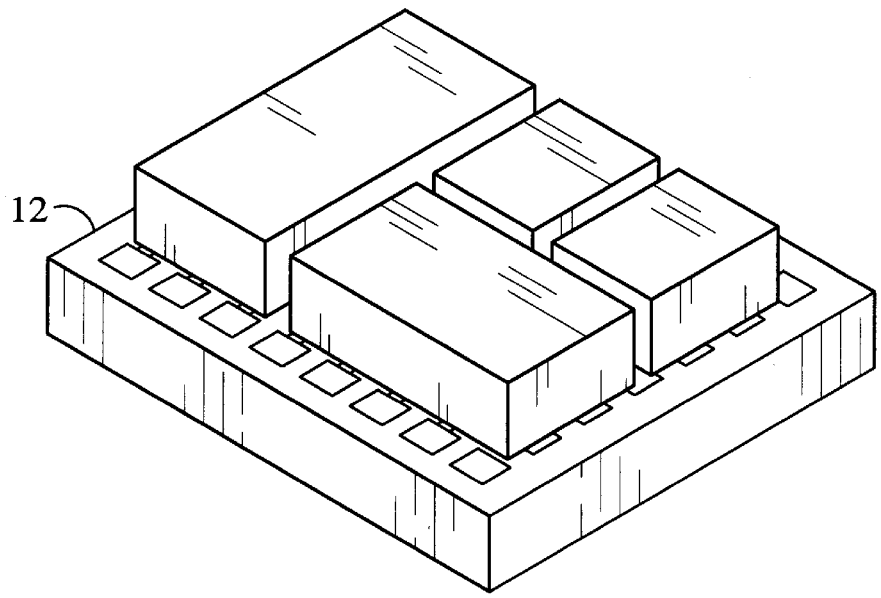

FIG. 5A shows a single IC 10 mounted on carrier 12. As shown in FIG. 5B, multiple ICs may also be mounted on carrier 12. Although FIGS. 5A and 5B show only ICs on carrier 12, resistors, capacitors, and other electrical components may be mounted on carrier 12 along with the ICs. Hence, carrier 12 functions as a multi-chip module within itself. This is very advantageous as more components may be interconnected on board 14. Moreover, with carrier 12 as an intermediate board, the interconnections are comparable to on-chip interconnects.

The process for fabricating the carrier 12 using a batch process includes employs conventional chemical vapor deposition techniques. In one example a wafer is prepared for processing by removing native oxide therefrom. Thereafter, the wafer surface is nucleated with a layer of copper approximately 4,000 angstroms thick. The copper layer is deposited to have a substantially even thickness over the surface of the wafer. A layer of photoresist is deposited over the nucleations layer to a thickness in the range of 8 to 10 microns. The layer of photoresist is used as a plating barrier to form the power planes 12a and 12b, shown above in FIG. 4. The power planes 12a and 12b are defined by a mask layer which is deposited atop of the photoresist.

Thereafter, a photoresist anisotropic etch step removes the photoresist from the regions defined by the mask, exposing the nucleation layer. A layer of copper 5.0 microns thick is disposed in the regions removed by the aforementioned etch step using electroplating techniques. Specifically, the periphery of the wafer is attached to a plating electrode to allow contact between the electrode and the nucleation layer. The wafer is then immersed in a copper electroplating bath where approximately 5 microns of copper are plated into the aforementioned regions. After completion of the electroplating step, the photoresist is removed leaving the patterned power planes 12a and 12b. The copper nucleation layer remains shorting all metal patterns present on the wafer.

A blanket wet etch is then performed to remove the copper nucleation layer and provide electrical isolation between power planes 12a and 12b. An adhesion promoter, 3-Aminopropyltriethoxysilane (3-APS), 0.5% in methanol, is used disposed on the wafer. The 3-APS solution is dynamically dispensed onto the center of the wafer while the wafer spins at 3000 rpm. The spin speed is then increased to 5000 rpm for 30 seconds to dry the surface. Thereafter, a dielectric layer of BCB is deposited. The dielectric layer has a thickness of approximately 5.0 microns and electrically insulates power planes 12a and 12b, forming a microstrip transmission line structure. The 3-APS enhances the adhesion of BCB to copper.

A second mask is disposed atop of the dielectric layer to position and define vias, which are subsequently etched during a Photo-BCB develop process. This is followed by the sputtering of a 4,000 angstrom thick TiCu which covers the entire wafer. The TiCu layer functions as a plating electrode for a subsequent copper electroplating step. The electrode attachment is on the outer edge of the wafer. A second layer of photoresist approximately 8 to 10 microns thick is deposited. The second photoresist is used as a plating barrier to form the one of the signal layers 12c and 12d, which is defined by a mask. The photoresist is then anisotropically etched, exposing the TiCu layer in various regions of the photoresist. Copper, up to five microns thick is deposited in the aforementioned vias, as well as the regions exposed during the anisotropic etch using an electroplating technique. The photoresist is then removed leaving the signal paths 12c and 12d formed by an additive process. A blanket wet etch is now performed to remove the TiCu layer and provide electrical isolation between signal layers 12c and 12d. Another layer of 3-APS adhesion promoter and BCB is then deposited. The layer of BCB is approximately 2.0 microns thick.

A fourth mask is applied to define the interconnections 21 and 22, followed by an etch which removes portions of the BCB layer. A nickel and gold plating is performed in the aforementioned portions. A fifth mask is applied to define the regions where segments of the BCB layer is removed, exposing regions of the silicon wafer. A dry etch is then used to remove the segments of the BCB layer. A layer of 3-APS adhesion promoter is now applied to the side of the wafer opposite to the side where the fifth mask was deposited, and a 2 micron thick layer of BCB is deposited thereon, defining a backside BCB layer. A sixth mask is disposed on the backside BCB layer and defines regions where the silicon wafer is to be exposed. A dry etch is used to expose the wafer silicon followed by removal of the silicon from these regions. The backside BCB layer is then removed. The board 14 is made in an analogous manner.

Figure 6:
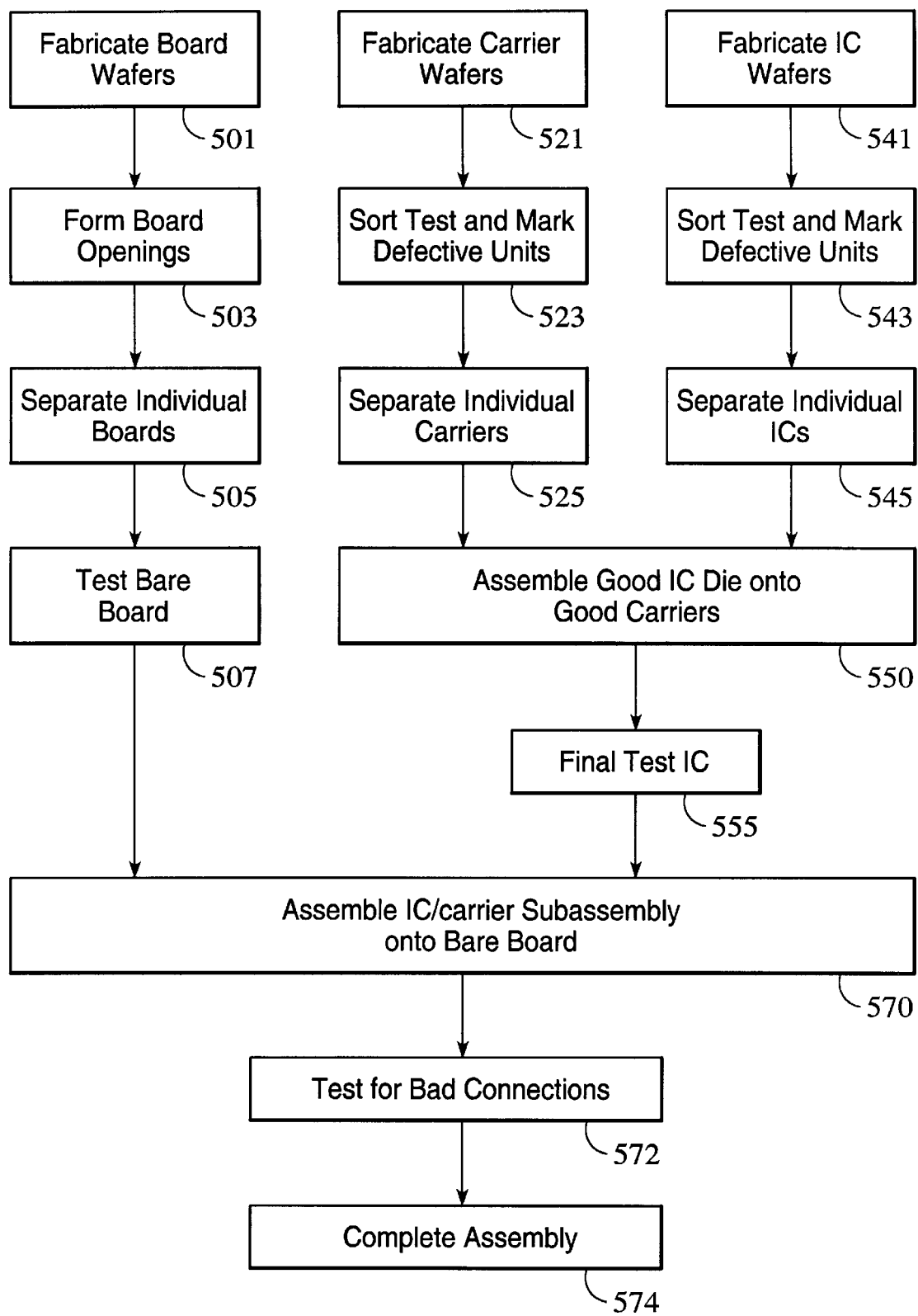
FIG. 6 shows the steps for interconnecting ICs efficiently according to the method of the present invention.

FIG. 6 is a flowchart showing the preferred method of interconnecting ICs according to the present invention. As shown, for each complex IC, the board wafers, the carrier wafers, and the IC wafers are separately manufactured. Referring to step 501, after the board wafers are fabricated, openings are formed in the boards at step 503. The individual boards are separated at step 505, and tested at step 507. The carriers are fabricated at step 521, and are tested and sorted for defective units at step 523. Defective units are discarded, and the good units are separated into individual carriers at step 525. Referring to steps 541 through 545, the ICs are also tested for defects once they are fabricated. The good units are also sorted from the defective units and are separated into individual ICs. At step 550, the good IC dies are mounted onto corresponding good carriers. After the ICs have been mounted to the carriers, a final test of the IC is conducted at step 555. This additional test before the IC is integrated with other subsystem ICs eliminates the burden of producing "known good die." Since no assumptions are made regarding the quality of the die, compound yield loss is also eliminated. The IC/carrier subassembly is mounted onto the board at step 570. Bad connections are tested for at step 572, and upon passing the test, the assembly is completed at step 574.

Figure 7:
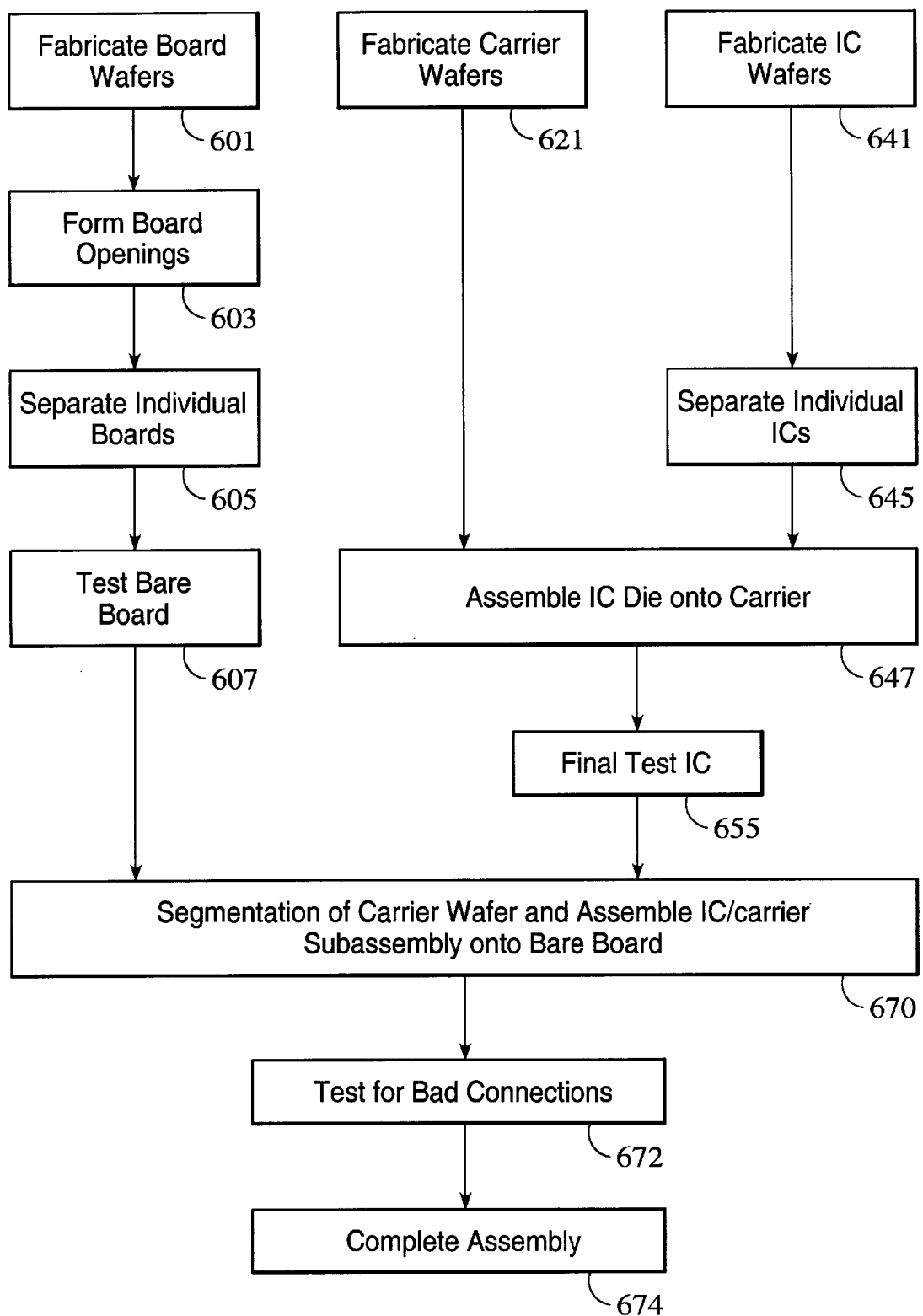
FIG. 7 the steps of a method for interconnecting ICs according to an alternate method of the present invention.
Figure 8:
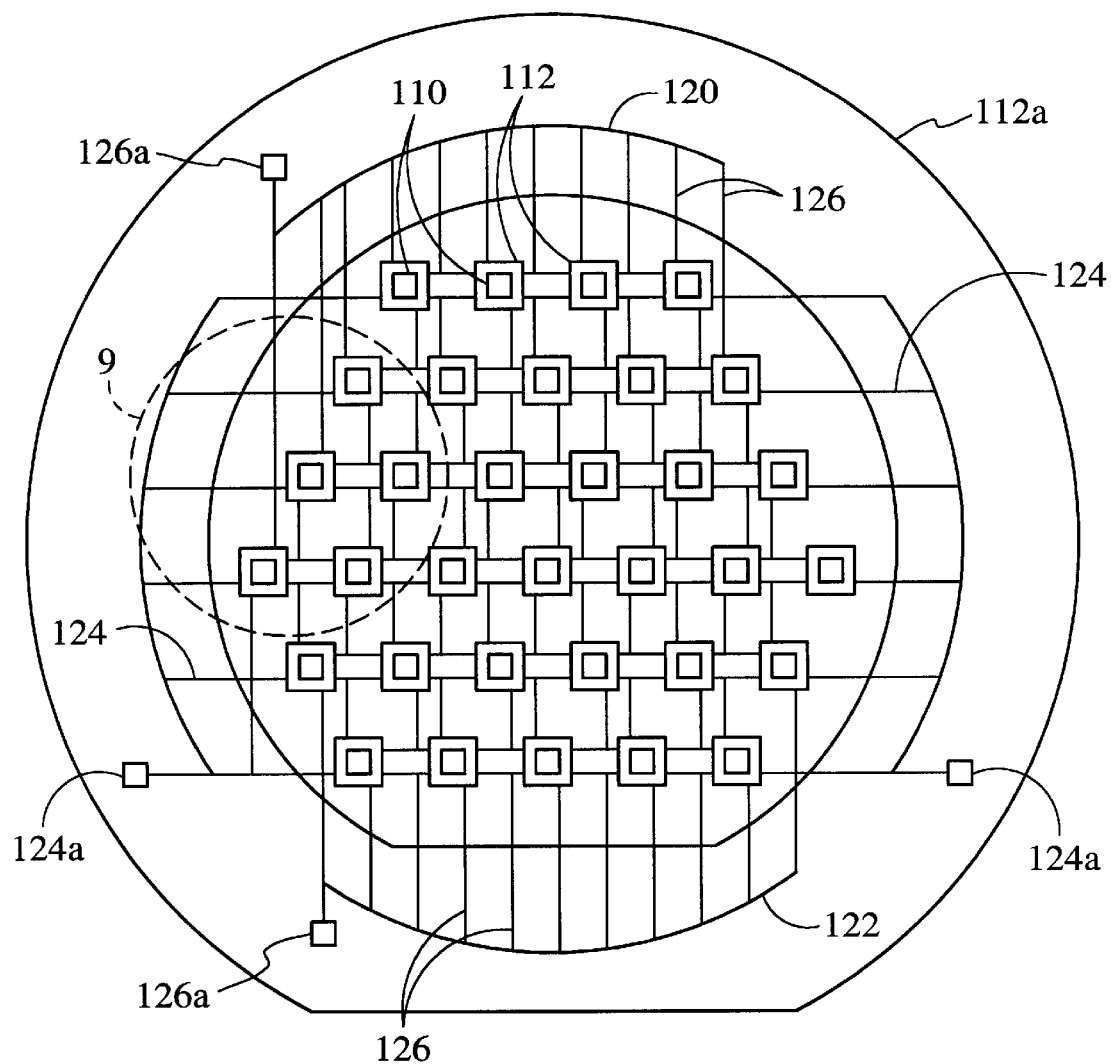
FIG. 8 is a simplified plan view of a carrier wafer in accord to the present invention.

Referring to FIGS. 7 and 8, an alternative method of interconnecting ICs according to the present invention is shown. Specifically, steps 601, 603, 605 and 607 correspond to steps 501, 503, 505 and 507, discussed above with respect to FIG. 6. The method shown in FIG. 7, however, differs in that the individual ICs 110 are assembled onto the carriers (not shown) before the carriers are segmented. Specifically, the carrier wafer 112a is fabricated at step 621 so as to have a plurality of spaced-apart carrier regions 112 located therein. In a separate process, ICs 110 are fabricated at step 641. Thereafter, the ICs 110 are segmented at step 645 and assembled onto the carrier wafer 112a at step 647, using the solder attach techniques discussed above. In this fashion, each carrier region 112 will have at least one IC 110 associated therewith.

Referring to FIGS. 3, 7 and 8, attachment of the ICs 110 before segmentation of the carriers 12 allows performing 100% functional testing or burn-in of the ICs 110, before final assembly. To that end, the carrier wafer 112a includes a power plane 120 and a ground plane 122, as well as signal paths 124. Each of the carrier regions 112 may be coupled to the power plane 120 and the ground plane 122 through interconnects 126. In this configuration, ICs 110, associated with the carrier regions 112, may be tested before completing assembly at step 570. Specifically, the signal paths 124, the ground and power planes 120 and 122 and the interconnects 126 are in electrical communication with the requisite connections 21 to facilitate biasing and signal transmission to the ICs 110. Thus, early detection of defective ICs 110 may be achieved. The carrier region 112 and IC 110 may be discarded after segmentation, but before final subassembly into a board 14, thereby saving the cost of disposing of a properly functioning board 14. In addition, reduced is the probability that damage to the IC 110 will occur during functional testing, because coupling of the test signals and bias voltages to the ICs 110 occurs at coupling pads 124a and 126a. There is no physical contact with the IC 110 and the testing unit (not shown) during burn-in.

Figure 9:
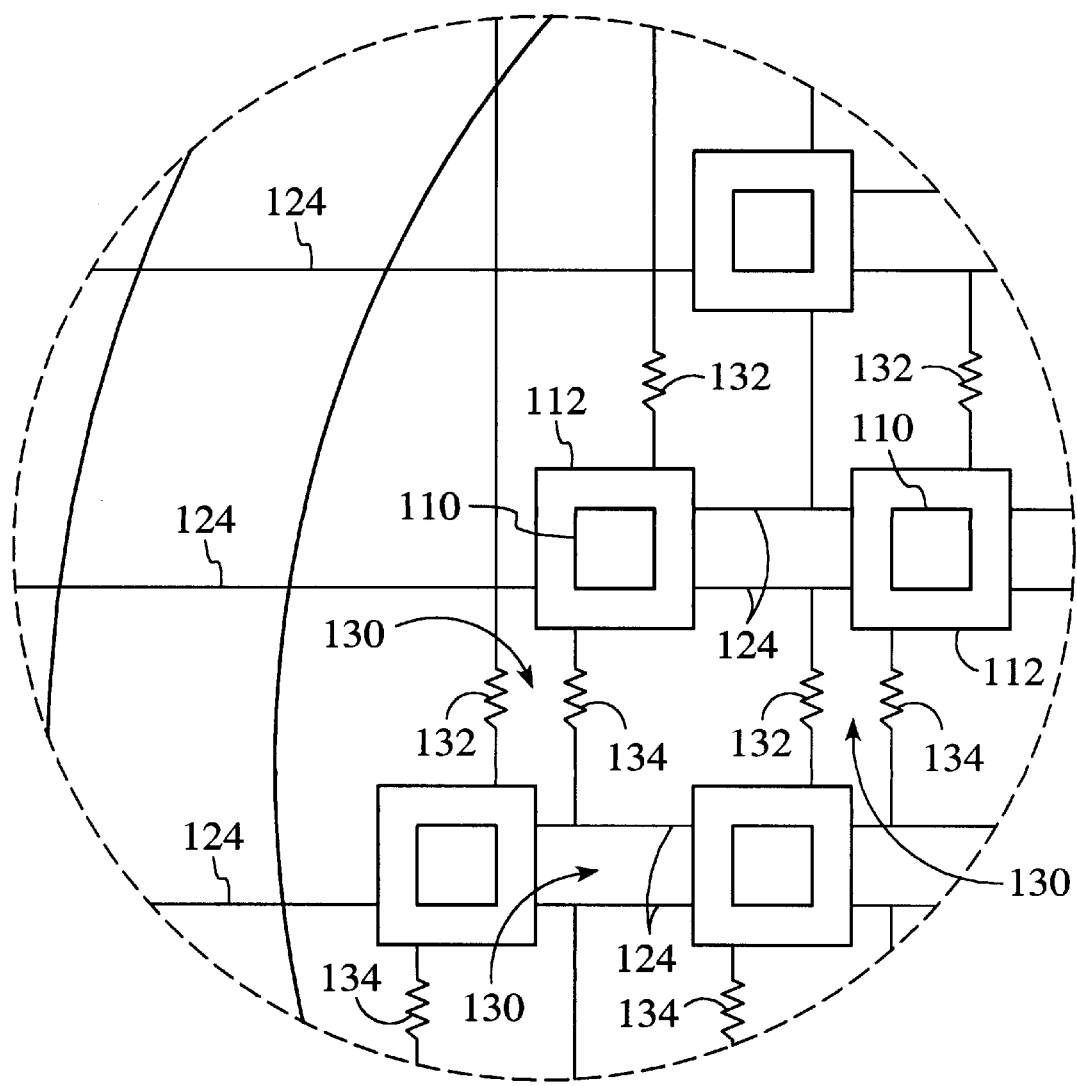
FIG. 9 a detailed plan view of a portion of the carrier wafer shown in FIG. 8.

Referring to FIGS. 8 and 9, the signal paths 124 and interconnects 126 are routed to each of the carrier regions 112 by passing through test circuitry regions 130, located between adjacent carrier regions 112. Also included in the test circuitry regions 130 are other circuit elements necessary to properly configure the ICs located in the carrier regions 112 for functional testing. For example, isolation resistors 132 and 134 may be disposed therein. In this fashion, each IC 110 may be coupled to the power plane 120 and ground plane 122 via isolation resistors 132 and 134, respectively. This prevents a short associated with one of the carrier regions 112, from shorting the entire carrier wafer 112a. During the segmentation step 670, shown in FIG. 7, the test circuit regions 130 and the power and ground planes 120 and 122, shown in FIG. 9, are bisected. This allows segmentation of the carrier wafer 112a without damaging the individual carrier regions 112. Bad connections are tested for at step 672, and upon passing the test, the assembly is completed at step 674, shown in FIG. 7.

Figure 10:
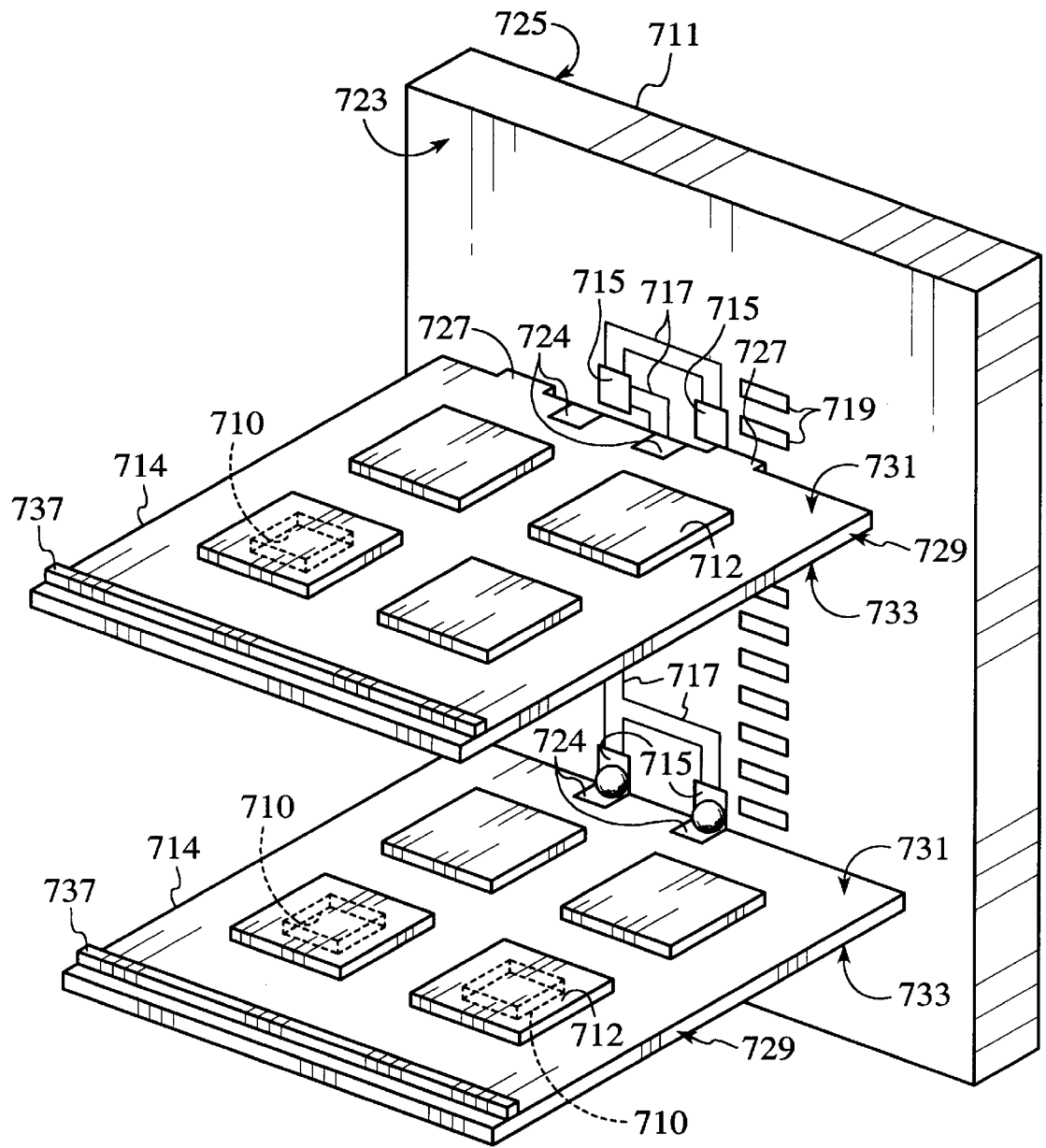
FIG. 10 is a perspective view of a microrack assembly.

Referring to FIG. 10, the overall bandwidth among the ICs 710 within a system is a major determinant of the performance of an electronics system, with the external performance of the ICs 710 being equal to the interconnect routing density times the frequency bandwidth between I/O pins. To further increase the density of the integrated circuits, in a unit volume, and the performance thereof, a backplane 711 is provided so that the individual boards 714 may be coupled thereto thereby extending the 2-D board 714 into a 3-D subassembly. As discussed above, the board 714 may have a carrier 712 with an integrated circuit 710 mounted thereto. The backplane 711 includes a plurality of bond pads 715 and a plurality of signal paths 717, with a subset of the plurality of bond pads lying on a first major surface 723 of the backplane 711. At least one through-way 719 is formed into the backplane 711 and extends, from an aperture 721 formed into the first major surface 723, toward an opposing major surface 725.

When extending the 2-D board 714 into a 3-D subassembly, it is desirable to as match as closely as possible the I/O bandwidth among the boards 714 to the bandwidth within the boards 714. This implies a high interconnect routing density between boards 714, requiring some form of structure move the signals between the planes of the 2-D boards 714. As a result, the complexity of a 3-D subassembly is approximately equal to the complexity of its constituent boards 714 times the number of the same. For example, in a subassembly having ten boards 714, the overall system level complexity is 10×. To interconnect the boards 714 and the backplane 711, precise control of the manufacturing tolerances of the same is necessitated. To that end, the backplane 711 is formed in a manner described above, with respect to the formation of boards 714. This allows establishing the mechanical tolerances of the various features of the subassembly using photolithography and etching techniques. Specifically, the crystalline structure of silicone allows precise etching of the board 714 and backplane 711. In this fashion, mechanical tolerances of 1 micron can be formed by the etching process. Assuming a worst case misalignment accuracy of 20%, pad pitches of 5 micron could be built. Therefore, the tolerances between the electrical connections and the mechanical structure may be set by the accuracy of the photo alignment equipment.

To facilitate accurate coupling of the boards 714 to the backplane 711, each board includes at least one tenon 727, one end of which has a cross-section complementary to a cross-section of the through-way 719. Although the tenon 727 may be formed so as to extend from any surface of the board 714, preferably at least one tenon 727 extends from a periphery 729 of the board 714 that lies in a plane orthogonal to the plane in which the opposed major surfaces 731 and 733 of the board 714 lie. In this fashion, upon reaching a final seating position, with respect to the backplane 711, the opposed major surfaces 731 and 733 of the board 714 lie in planes that extend transversely to the planes in which opposed major surfaces 723 and 725 lie. In this final seating position, at least one of the plurality of bond pads 715 is positioned adjacent to one of the plurality bond pad pattern connections 724 on the board 714.

To fixedly position the board 714 with respect to the backplane 711, it is preferred to solder the bond pad 715 to a bond pad pattern connection 724 positioned adjacent thereto, defining a joint 735. To that end, the bond pads 715 and the bond pad pattern connections 724 must include a material which wettable by solder. Typically, the bond pads 715 and the bond pad pattern connections 724 are plated with gold or nickel. The solder may be flowed employing any technique known in the art. Preferably, however, the solder is flowed employing a localized heating technique such as infra-red. In this manner, solder may be flowed without subjecting areas surrounding the solder to excessive heat. Typically, the distance between adjacent boards 714 is a function of the worst case tolerance which determines the size of the throughway 719 relative to the tenon 727. The height of the pads on the board 714, the backplane 711 and the quantity of solder employed must be sufficient to ensure that there are no voids in the joint 715.

An advantage with employing solder is that it facilitates rework by allowing replacement of a defective board 714 or integrated circuit 710 present thereon. This is particularly important considering that the 10×increase provided by mounting ten boards 714 to a backplane 711 results in a 10×higher probability of system level defects, compared to an individual board 714. With solder, rework of the subassembly is facilitated by reflowing the solder to decouple a defective board 714 from the backplane 711, shown more clearly at joints 837 in FIG. 11. Referring again to FIG. 10, during the rework process, the bond pads 715 and the bond pad connections 724 may be cleaned in a manner similar to the rework procedures for flip-chip technology. The process used for final assembly may then be repeated. After final assembly, the 3-D subassembly can be placed in a protective package and connections to the next level made.

To relieve stress at the joint 735, a side of the boards 714 positioned opposite to the joint 735 may include a stud 737 extending from one of the major surfaces. The stud 737 has dimensions sufficient to contact an adjacent board 714 and reduces cantilevering of the boards about the joint 737.

Figure 11:
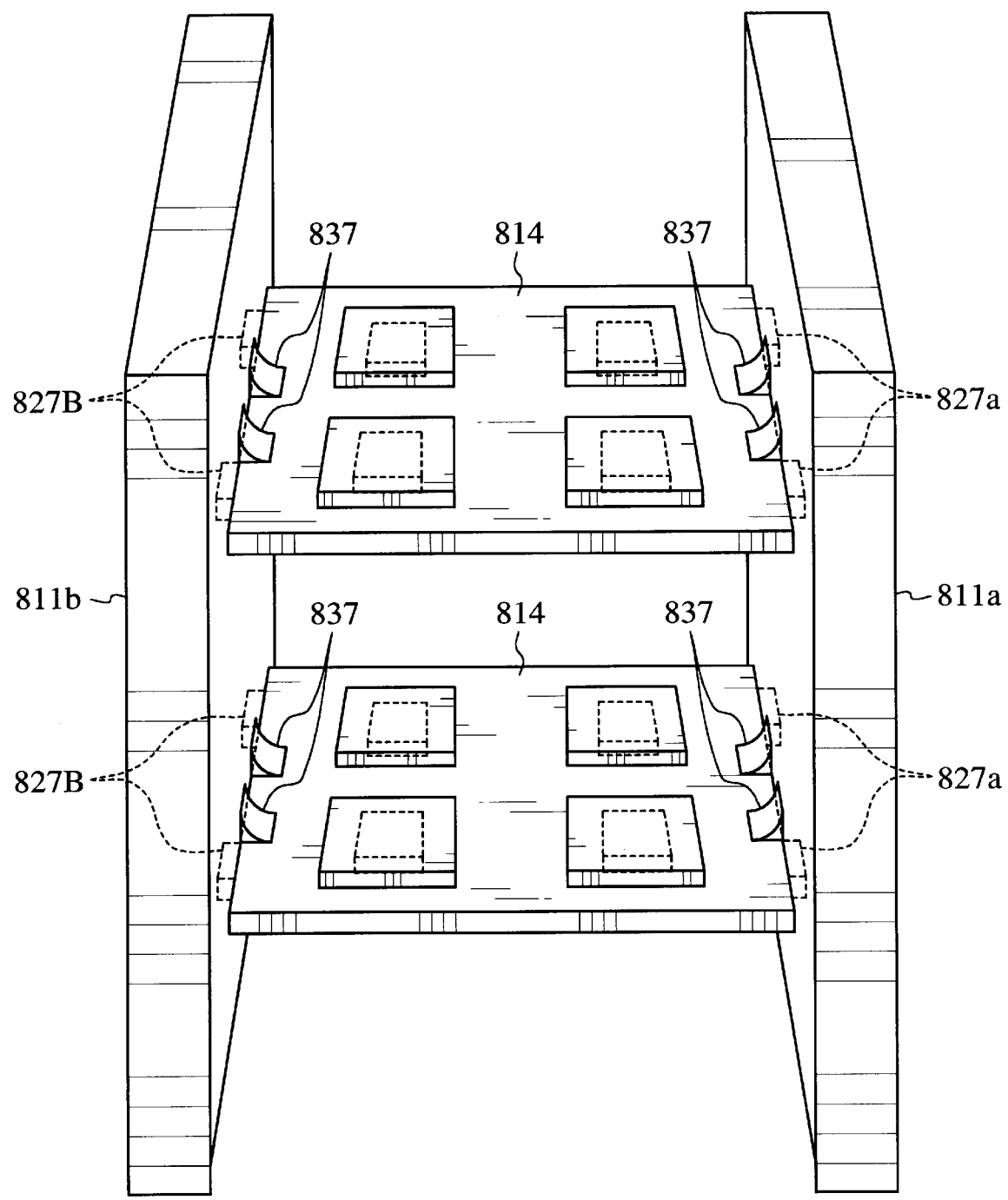
FIG. 11 is a perspective view of a microrack assembly in accordance with an alternative embodiment.

Referring to FIG. 11, in another embodiment, cantilevering of the board 814 about the joints 837 may be avoided by providing a second backplane 811b, which may be disposed opposite to the first backplane 811a or extend transversely thereto. The second backplane 811b is similar to the first backplane, but the board 814 would include first and second sets of tenons 827a and 827b, each of which is to be uniquely associated with one of the first and second back planes 811a and 811b. An added benefit of having multiple backplanes is that shorter signal paths may be provided, thereby reducing the worst case path length between signals on any boards to the average of board width plus the backplane separation. This reduces parasitic capacitances and inductances while increasing the transmission speed of signal in the 3-D module.

Figure 12:
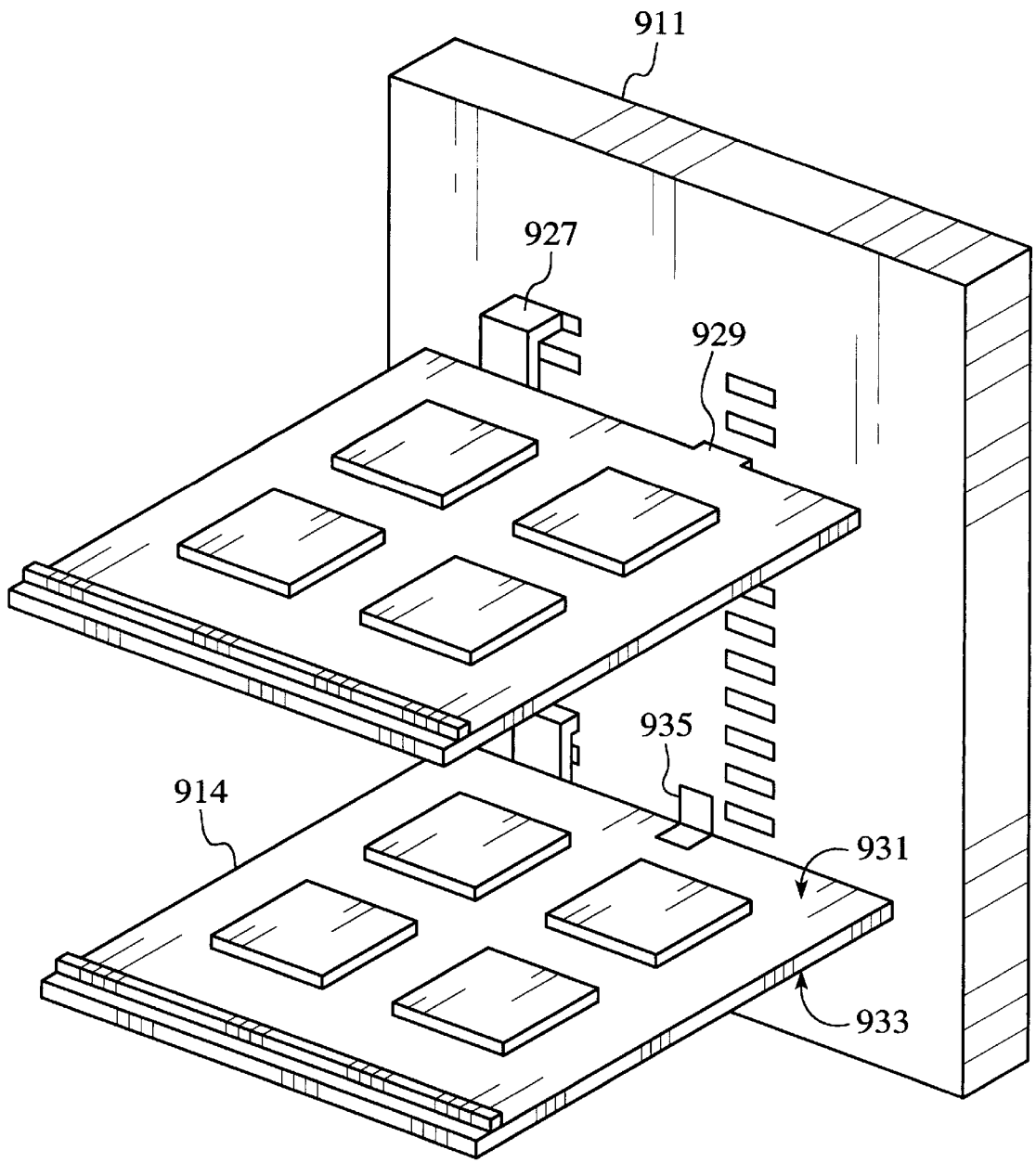
FIG. 12 is a perspective view of a microrack assembly in accordance with a second alternative embodiment.

Referring to FIG. 12 another embodiment to prevent cantilevering of the boards 914 about the joints 915 includes having tenons 927 attached to the backplane at differing distances from one of the opposed major surfaces 931 and 933 of the board 914. To that end, one or more of the tenons 927 may extend, toward the backplane 911, from one of the opposed major surfaces 931 and 933, with the remaining tenons 929 extending from the periphery. In this fashion, the cantilevering of the boards 914 about the joints 915 is reduced due to the joints lying in two different planes.

What is claimed is:

1. A mounting assembly for an integrated circuit comprising:

a first insulative member having a plurality of bond sites disposed thereon and a plurality of signal traces, each of which extends from one of said plurality of bond sites, with a subgroup of said plurality of bond sites lying on a surface of said first insulative member extending in a first plane;

a second insulative member having a plurality of signal paths and a plurality of bond pads disposed thereon, with a subset of said plurality of bond pads lying on a face of said second insulative member extending in a second plane, with said first plane extending transversely to said second plane and said first insulative member having a plurality of apertures formed therein, said second insulative member including a plurality of tenons having a shape complementary to a cross-section of said apertures and being disposed therein, defining a joint between said first and second insulative members; and a brace, coupled to said second insulative member, to reduce movement about said joint.

2. The mounting assembly as recited in claim 1 wherein said brace includes having one of said plurality of tenons include a first section extending from said face transversely to said second plane and terminating in a second section extending parallel to said second plane and transversely to said first plane.

3. The mounting assembly as recited in claim 1 further including a plurality of said second insulative members.

4. The mounting assembly as recited in claim 1 wherein said second insulative member includes a periphery and further including a plurality of said first insulative members, each of which lies in a differing plane, with said brace including a first subset of said plurality of tenons disposed in apertures of one of said plurality of insulative members, with a second subset of said plurality of tenons being disposed in the apertures of a differing first insulative member of said plurality of first insulative members.

5. The mounting assembly as recited in claim 1 further including a stud extending from said face, with said stud being positioned proximate to an edge of said face disposed opposite to said first insulative member.

6. The mounting assembly as recited in claim 1 wherein said first and second insulative member are formed from silicon.

7. The mounting assembly as recited in claim 1 wherein a first group of said plurality of bond pads enclose a region of said first insulative member and a second group of said plurality of signal paths are associated with said first group of bond pads and extend away from said region, defining an electrically nonconductive area, and further including a routing carrier having a plurality of conductive traces and a plurality of conductive bond areas, a third group of which superimposes said first group bond pads so that each of said third group bond areas superimposes one of said first group of bond pads, with one of said plurality of conductive traces superimposing said nonconductive area and extending between a pair of bond areas of said third group so as to place a pair of said bond pads of said first group in electrical communication.

8. The substrate as recited in claim 7 wherein said integrated circuit is coupled to the remaining bond areas of said routing carrier and is positioned thereon so as to superimpose said nonconductive area.

9. The substrate as recited in claim 7 wherein said integrated circuit is coupled to the remaining bond pads of said routing carrier and said nonconductive area includes an orifice having an area which exceeds a cross-sectional area of said integrated circuit, said integrated circuit being positioned on said routing carrier so as to fit within said orifice.

10. A mounting assembly for an integrated circuit comprising:

a first insulative member having a plurality of bond sites disposed thereon and a plurality of signal traces, each of which extends from one of said plurality of bond sites, with a subgroup of said plurality of bond sites lying on a surface of said first insulative member extending in a first plane;

a plurality of second insulative members, each of which includes a face having a plurality of signal paths and a plurality of bond pads disposed thereon, said face being surrounded by a periphery and extending in a second plane orientated transversely to said first plane, with a pair of tenons extending from said periphery, said first insulative member having a plurality of spaced-apart apertures formed therein, with each of said pair of tenons of each of said plurality of second insulative members being disposed within one of said plurality of spaced-apart apertures with each of said plurality of second insulative members extending from said first insulative member parallel to an adjacent second insulative member upon said plurality of second insulative members and said first insulative member reaching a final seating position, and a stud extending from said face, with said stud being positioned proximate to a portion of said periphery disposed opposite to said first insulative member.

11. The mounting assembly as recited in claim 10 further including a conductive fusible alloy rigidly affixing one of said bonds pads with one of said bond sites.

12. The mounting assembly as recited in claim 11 wherein said plurality of bond pads are arranged as a groups, each of which encloses a region of said second insulative member, forming multiple regions, with signal traces associated with each of said plurality of groups, extending away from said region, defining a plurality of electrically nonconductive areas, and further including a plurality of routing carriers each of which has a plurality of conductive traces and a plurality of conductive bond areas, a subportion of said conductive bond areas superimposes one of said groups of said plurality of bond pads so that each of said conductive bond areas of said subportion superimposes said one of said groups, with one of said plurality of conductive traces superimposing said nonconductive area and extending between a pair of bond areas of said subportion so as to place a pair of said bond pads of said one of said groups in electrical communication.

13. The mounting assembly as recited in claim 12 wherein an integrated circuit is coupled to the remaining bond areas of each of said routing carrier and is positioned thereon so as to superimpose said nonconductive area.

14. The mounting assembly as recited in claim 13 wherein said nonconductive area includes an orifice having an area which exceeds a cross-sectional area of said integrated circuit, said integrated circuit being positioned on said routing carrier so as to fit within said orifice.

15. The mounting assembly as recited in claim 14 wherein said first and insulative member and each of said plurality of second insulative members are formed from silicon.

16. A method of routing signal paths on first and second insulative members comprising steps of:

depositing, on said first insulative member, a plurality of spaced-apart bond sites and a plurality of signal traces, with each of said plurality of signal traces extending from one of said plurality of bond sites, and a distance between adjacent bond sites defining a first pitch, said first insulative member including a surface lying in a first plane with said plurality of bond sites and said plurality of signal traces lying in said first plane;

depositing, on said second insulative member, a plurality of spaced-apart bond pads and a plurality of signal paths, with each of said plurality of signal paths extending from one of said plurality of bond pads and a distance between adjacent bond pads defining a second pitch, said second insulative member including a face lying in a second plane with said plurality of bond pads and said plurality of signal paths lying in said second plane;

forming a plurality of spaced-apart apertures in said first insulative member, within a first predetermined tolerance;

forming a plurality of spaced-apart tenons in said second insulative member within a second predetermined tolerance, with each of said plurality of spaced-apart tenons being adapted to fit into one of said plurality of spaced-apart apertures;

coupling said first and second insulative members together defining a joint therebetween; and bracing said second insulative member to reduce movement about said joint.

17. The method as recited in claim 16 wherein each of said plurality of bond pads are positioned adjacent to one of said plurality of bond sites after said coupling step and further including the step of soldering each of said plurality of bond sites to one of said plurality of bond pads positioned adjacent thereto.

18. The method as recited in claim 16 wherein said second insulative member includes a periphery with each of said plurality of tenons extending from said periphery with said first and second planes being positioned orthogonally to each other after said coupling step.

19. The method as recited in claim 16 wherein said first and second insulative members are formed from a silicon compound.

* * * * *